United States Patent [19]

Takahashi

[11] Patent Number: 4,595,282

[45] Date of Patent: Jun. 17, 1986

[54] RECORDING APPARATUS

[75] Inventor: Kazuo Takahashi, Kawasaki, Japan

[73] Assignee: Canon Kabushiki Kaisha, Tokyo, Japan

[21] Appl. No.: 633,348

[22] Filed: Jul. 23, 1984

[30] Foreign Application Priority Data

Aug. 2, 1983 [JP] Japan .................................. 58-140567

[51] Int. Cl.⁴ ............................................ G03B 27/42
[52] U.S. Cl. ..................................................... 355/53
[58] Field of Search ...................... 355/53, 54, 61, 62, 355/65

[56] References Cited

U.S. PATENT DOCUMENTS

| 3,797,935 | 3/1974 | Marcy | 355/53 |
| 4,155,642 | 5/1979 | Lacombat | 355/54 X |
| 4,473,292 | 9/1984 | Mayer | 355/53 |
| 4,477,183 | 10/1984 | Kawamura et al. | 355/54 X |

Primary Examiner—L. T. Hix
Assistant Examiner—Brian W. Brown
Attorney, Agent, or Firm—Fitzpatrick, Cella, Harper & Scinto

[57] ABSTRACT

A recording apparatus for use with a radiation-sensitive member includes a holder for holding the radiation-sensitive member, an image forming system for applying a radiation energy, having a pattern of distribution, to the radiation-sensitive member to form an image thereon, a vibration meter for measuring vibration to detect relative movement between the radiation-sensitive member and the pattern of the radiation energy to be applied to the radiation-sensitive member, and a discriminating circuit for discriminating, on the basis of the output from the vibration meter, whether the image forming system is to be actuated, whereby any positional deviation of or any distortion in the image is mitigated.

13 Claims, 4 Drawing Figures

RECORDING APPARATUS

BACKGROUND OF THE INVENTION

This invention relates to an apparatus for transferring a pattern of an original or an apparatus for forming an image with the use of an electron beam or a laser beam.

Projection type image forming apparatus such as an exposure apparatus for transferring, onto a radiation-sensitive or photosensitive wafer, a fine pattern formed on a mask or reticle (which will hereinafter be also referred to simply as a "mask") through a proximity process or with a projection optical system; an exposure apparatus for forming a fine pattern on a wafer through the scan of an electron beam; or a laser beam printer for forming a fine image on a photosensitive or radiation-sensitive member through the scan of a laser beam are distinguished from contact type image forming apparatus such as a semiconductor exposure apparatus of contact type in that, in the former types, the image is projected onto the radiation-sensitive or photosensitive member via a "space", which leads to a problem of positional deviation or displacement between the image to be projected and the sensitive member due to the vibration caused within the apparatus itself or generated by any external cause.

The projection type image forming apparatus as mentioned above has not employed any means for detecting the image fluctuation due to the vibration. Rather, a vibroisolating stage has been employed to absorb the vibration transmitted from the floor to suppress transfer of the vibration to the apparatus. In addition, with respect to the vibration which might be caused within the apparatus itself, the inertial mass or moving speed of each of various movable parts of the apparatus has been decreased to minimize the occurrence of the vibration.

Further, in view of the fact that the vibration caused by the movement of the movable parts is damped or attenuated after the lapse of a predetermined time period past the completion of the movement so that the relative amplitude is decreased, a suitable delay time has been selected on the basis of experimental results on the damping time, and the apparatus has been arranged so that, after the lapse of this delay time past the completion of the movement of the movable parts, the succeeding step such as exposure is initiated. Since, however, the moving speed should generally be high where the amount of movement of the movable part is large, the damping time in such case is accordingly longer. Therefore, a longer delay time is usually selected for the purpose of ensuring reliable operation. The selection of such longer delay time which is fixed is, however, not so advantageous in a case where the amount of movement is small, since the waste of time leads to a decreased throughput.

Moreover, if a vibration which is not sufficiently attenuated within the preset delay time occurs due to any external cause such as an earthquake, the succeeding exposure step or the like would be carried out without correcting the positional deviation or displacement between the image to be projected and the sensitive member.

SUMMARY OF THE INVENTION

It is accordingly a primary object of the present invention to provide an apparatus for forming a satisfactory image on a recording material. The word "image" as used herein means not only an image which can be visualized after being subjected to a process such as a developing process, but also an image which is already visible in its initial state.

A second object of the present invention is to provide an image forming apparatus wherein any adverse effects such as distortion or positional deviation in the formed image which might be caused by the vibration is prevented.

A third object of the present invention is to provide an image forming apparatus wherein the degree of vibration attenuation is made selectable in accordance with the image quality required so that the waiting time for the initiation of the succeeding step is optimized.

A fourth object of the present invention is to provide a step-and-repeat exposure apparatus wherein the waiting time required during the repetition of the same step is minimized to improve the throughput.

In accordance with one aspect of the present invention, there is provided a semiconductor exposure apparatus of the reduction projection type wherein means are provided for effecting real time measurement of the amount of relative positional deviation, resulting from vibration, between the pattern of a reticle to be projected onto the surface of a wafer and the wafer or the pattern already formed on the wafer. Therefore, at a time when the amplitude of the relative positional deviation is reduced to such a degree that would not adversely affect the image transfer, a command signal for starting the next operation is produced.

In accordance with another aspect of the present invention, vibration resulting from any external cause such as an earthquake can be detected. It becomes, therefore, possible to stop the operation of the apparatus until the vibration is sufficiently attenuated, to thereby effectively minimize the production of defective products.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
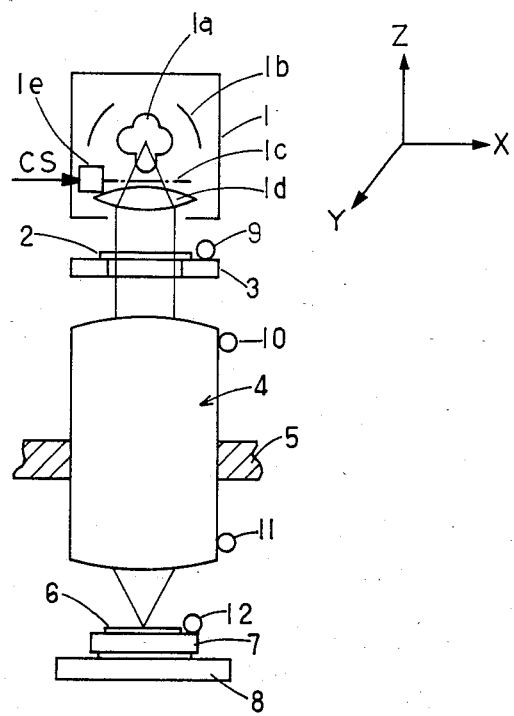
FIG. 1 is an optical cross-sectional view showing an embodiment of an exposure apparatus according to one aspect of the present invention.

Referring now to the drawings, embodiments of the present invention will be described. FIG. 1 shows the optical arrangement of a projection exposure apparatus according to one aspect of the present invention.

The exposure apparatus includes an illumination unit 1 comprising a light source 1a, reflecting mirrors 1b, shutter 1c, condensing lens 1d and actuator 1e for the shutter 1c. The illuminating unit 1 uniformly illuminates a reticle or a mask 2 on which a circuit pattern is formed. The reticle 2 is held on a reticle holder 3 on which a first accelerometer 9 for detecting vibration of the reticle 2 is secured. Beneath the reticle holder 3, a reduction projection lens 4 is disposed which is secured to a frame member 5 of the exposure apparatus. The projection lens 4 projects the circuit pattern image of the reticle 3 onto the surface of a wafer 6. On the upper and lower portions of the projection lens 4, second and third accelerometers 10 and 11 are secured, respectively, to detect the vibration of the projection lens 4. The wafer 6 is held by vacuum or the like on a wafer chuck 7 on which a fourth accelerometer 12 for detecting the vibration of the wafer 6 is secured. The wafer 6 and wafer chuck 7 are moved by a wafer stage 8 for the step-and-repeat movement. As an alternative, the fourth accelerometer 12 may be provided on the wafer stage 8 to detect the vibration of the wafer 6. In the illustrated embodiment, each of the accelerometers 9, 10, 11 and 12 is provided to detect the vibration of the corresponding one of the reticle 2, upper and lower portions of the projection lens 4 and wafer 6 only in one direction. However, it is easily understood that the reliability of the exposure apparatus with respect to the vibration can be improved where three accelerometers having X, Y and Z detecting directions, respectively, are provided at each of the detecting positions in FIG. 1 to detect the vibration in X, Y and Z directions with respect to the exposure apparatus. In such case, it is important that one of these three accelerometers is located in accordance with the co-ordinate axis of the exposure apparatus.

Figure 2:
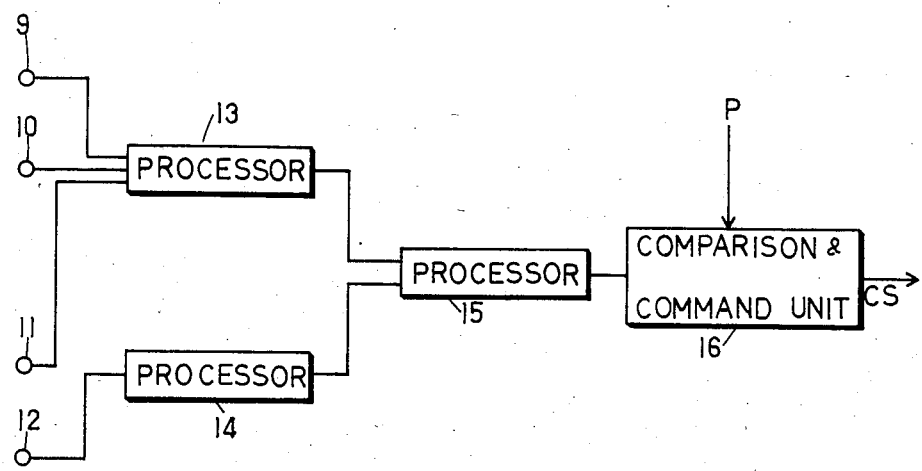
FIG. 2 is a block diagram showing a signal processing circuit of the apparatus shown in FIG. 1.

Referring now to FIG. 2 showing a block diagram of the electric system of the embodiment shown in FIG. 1, there is provided a first processing unit 13 to which acceleration signals are supplied from the accelerometers 9, 10 and 11. The processing unit 13 converts, by integration, each acceleration signal into displacement and calculates the absolute amount of fluctuation of the pattern image of the reticle 2 to be projected onto the wafer 6. Each of the outputs from the accelerometers 9, 10 and 11 does not correspond to the absolute fluctuation of the pattern image, since the former depends on the locations of the reticle holder 3, projection lens 4, and accelerometers 9, 10 and 11 in the exposure apparatus or on the magnification of the projection lens 4. It is therefore desirable to provisionally detect the relation between each of the accelerometers 9, 10 and 11 and the absolute amount of fluctuation of the pattern image, and to calculate the displacement on the basis of the detected relation. In this case, the processing unit 13 compares the displacements calculated on the basis of the signals supplied thereto from the accelerometers 9, 10 and 11 with each other, and outputs the maximum value to a second processing unit 15 connected thereto.

A third processing unit 14 receives an output signal supplied from the accelerometer 12 and, after converting by integration the signal into a displacement, outputs a signal to the second processing unit 15. The processing unit 15 compares the output signals supplied thereto from the processing units 13 and 14 to detect the difference therebetween and calculates the amount of relative deviation between the pattern image of the reticle 2 and the wafer 6. Therefore, the processing unit 15 outputs a signal to a comparison and command unit 16 in which a permissible value P which is changeable in accordance with the pattern precision required is preset. Thus the comparison and command unit 16 compares the preset permissible value P with the amount of relative deviation between the pattern image and the wafer supplied from the processing unit 15, and, if the amount of relative deviation is not greater than the permissible value P, it generates a command signal CS. This command signal CS is one which commands initiation of the next step, i.e. image transfer, so that the actuator 1e is operated to release the shutter 1c. The command signal CS may of course be used to effect the stoppage of the next operation, or used to effect a display indicating that the initiation of the succeeding step is permissible.

While, in the illustrated embodiment, accelerometers such as at 9, 10 and 11 are employed to detect the amount of relative deviation between the pattern image and the wafer, the present invention is not limited thereto, and the accelerometers can be replaced by minute displacement gauges.

Figure 3:
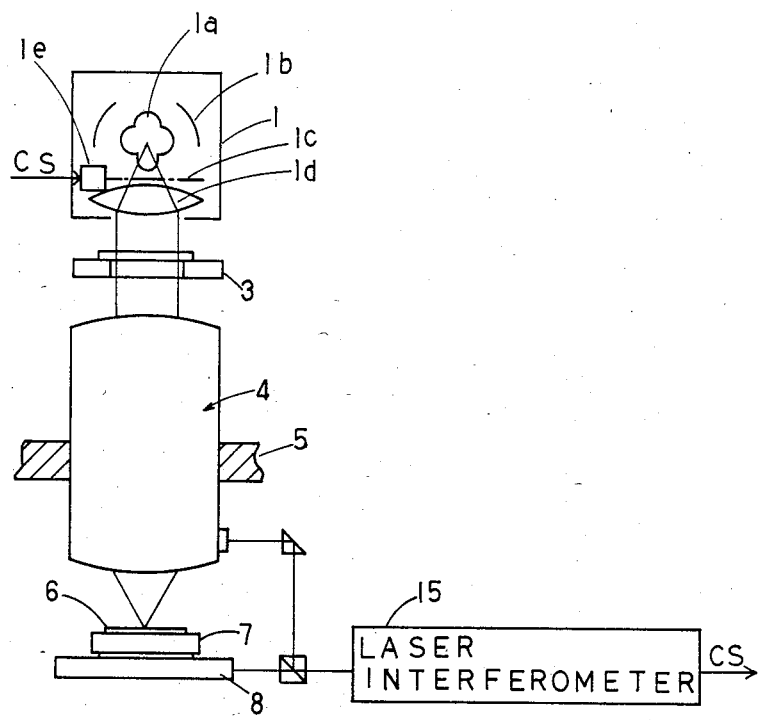
FIG. 3 is an optical cross-sectional view showing another embodiment of the exposure apparatus according to another aspect of the present invention.

Further, a laser interferometer which is used in an exposure apparatus to achieve alignment between a projection lens and a wafer stage can be employed. FIG. 3 illustrates such an exposure apparatus having a laser interferometer 15. Similar elements to those in the FIG. 1 embodiment are denoted by similar reference numerals in FIG. 3. Since, except for the substitution of the laser interferometer system for the detecting system of accelerometers shown in FIG. 1, the exposure apparatus of the present embodiment has substantially the same arrangement as that shown in FIG. 1, a detailed description of the present embodiment is omitted for the purpose of simplicity of explanation.

As a further alternative, the amount of absolute deviation of the wafer can be detected by the combination of a surface table and a scale used for positioning of the wafer stage.

Figure 4:
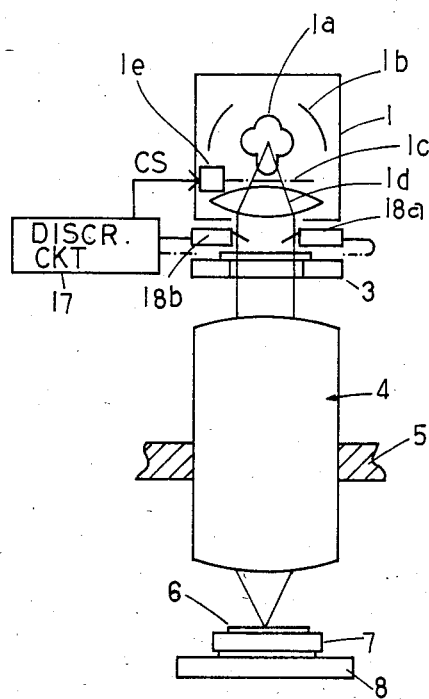
FIG. 4 is an optical cross-sectional view showing a third embodiment of the exposure apparatus according to a third aspect of the present invention.

FIG. 4 shows a projection exposure apparatus having a TTL (through the lens) alignment system wherein alignment marks formed on a mask and a wafer are detected by detectors 18a and 18b via a projection optical system to achieve alignment between the mask and wafer. In accordance with the present invention, the projection exposure apparatus shown in FIG. 4 includes a vibration discriminating circuit 17 which detects the vibration of the aligment marks to detect the amount of relative deviation between the projection pattern image of the mask and the wafer. The electric system for signal processing in this embodiment includes a comparison and command circuit such as 16 shown in FIG. 2, and the other elements shown in FIG. 2 may be omitted. Except for the vibration detecting system, the exposure apparatus of FIG. 4 has substantially the same arrangement as of FIG. 1 embodiment, and similar elements are denoted by similar reference numerals in FIG. 1. A further detailed description of the present embodiment is thus omitted only for the purpose of simplicity of explanation.

Turning now again to the FIG. 1 embodiment, if very precise pattern alignment accuracy is not required, the accelerometers 10 and 11 for the projection lens 4 may be omitted, or the accelerometer 9 for the reticle 2 may be omitted so that only the vibration of the wafer 6 is detected.

In accordance with the present invention, as has hitherto been described, the amount of relative positional deviation between the image to be projected and the radiation-sensitive member such as a wafer is detected by real time monitoring, and whether or not the amount of positional deviation adversely affects the imagewise exposure is discriminated in the manner as has been described in the foregoing. The provision of the vibration detecting system for detecting the positional deviation between the image to be projected and a radiation-sensitive member such as a wafer ensures an exposure apparatus providing higher throughput. Moreover, the image forming accuracy is adjustable according to the present invention, so that it can be lowered if very precise image transfer is not required. Therefore, the throughput of the apparatus can be further improved.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for use with a radiation-sensitive member, comprising:
   means for holding the radiation-sensitive member;
   image forming means for applying radiation energy having a distribution pattern to the radiation-sensitive member to form an image thereon;
   vibration detecting means for detecting relative vibratory movement between the radiation-sensitive member and the distribution pattern of the radiation energy to be applied to the radiation-sensitive member, said detecting means producing a detection signal; and
   means for discriminating, on the basis of the detection signal supplied from said detecting means, whether said image forming means is to be actuated.

2. An apparatus according to claim 1, wherein said vibration detecting means detects vibration in three directions in a three-dimensional rectangular co-ordinate system.

3. An apparatus according to claim 1, wherein said vibration detecting means comprises an accelerometer.

4. An apparatus according to claim 1, wherein said vibration detecting means comprises a laser interferometer.

5. An apparatus according to claim 1, wherein said vibration detecting means is connected to said radiation-sensitive member holding means.

6. An apparatus according to claim 5, wherein said radiation-sensitive member holding means is movable in orthogonal directions, wherein said vibration detecting means detects vibration in three directions in a three-dimensional rectangular coordinate system and wherein at least one of the three-directions in the three-dimensional rectangular coordinate system coincides with one of the moving directions of said radiation-sensitive member holding means.

7. An apparatus according to claim 1, wherein said vibration detecting means comprises a first vibration detecting means connected to said radiation-sensitive member holding means to detect vibration with respect thereto and a second vibration detecting means connected to said image forming means to detect vibration with respect thereto, and wherein said discriminating means produces an operation command signal to actuate said image forming means on the basis of at least the outputs from said first and second vibration detecting means and a preset permissible value.

8. An apparatus according to claim 1 and for use with a mask having a pattern formed thereon, wherein said image forming means comprises a mask holder for holding the mask, illumination means for illuminating the mask, controlling means for controlling said illumination means and a projection optical system for projecting the pattern of the mask onto the radiation-sensitive member.

9. An apparatus according to claim 8, wherein said vibration detecting means comprises a plurality of vibration detecting means one of which is connected to said radiation-sensitive member holding means and another one of which is connected to said mask holder.

10. An apparatus for use with an information bearing member for bearing thereon information, comprising:
    means for holding the information bearing member;
    means for recording information on the information bearing member;
    vibration detecting means for detecting vibration to detect relative movement between said recording means and the information bearing member; and
    means for permitting the operation of said recording means, said permitting means discriminating whether the relative movement as aforesaid falls within a value not greater than a preset permissible value.

11. An apparatus according to claim 10, wherein the permissible value is changeable.

12. An apparatus according to claim 10, wherein said permitting means operates said recording means when the relative movement as aforesaid falls within a value not greater than the permissible value.

13. An apparatus according to claim 10 and for use with an original having a pattern formed thereon, wherein said recording means comprises a holder for holding the original, illumination means for illuminating the original and projection optical means for projecting the pattern of the original onto the information bearing member.

* * * * *